(12) United States Patent
Osaka

(10) Patent No.: US 7,448,880 B2
(45) Date of Patent: Nov. 11, 2008

(54) MULTILAYER PRINTED CIRCUIT BOARD FOR HIGH-SPEED DIFFERENTIAL SIGNAL, COMMUNICATION APPARATUS, AND DATA STORAGE APPARATUS

(75) Inventor: Hideki Osaka, Oiso (JP)

(73) Assignee: Hitachi, Ltd., Tokyo (JP)

( * ) Notice: Subject to any disclaimer, the term of this patent is extended or adjusted under 35 U.S.C. 154(b) by 198 days.

(21) Appl. No.: 11/601,734

(22) Filed: Nov. 20, 2006

(65) Prior Publication Data

US 2007/0130555 A1 Jun. 7, 2007

(30) Foreign Application Priority Data

Nov. 22, 2005 (JP) .............................. 2005-336725

(51) Int. Cl.
*H01R 12/00* (2006.01)
(52) U.S. Cl. ...................................................... 439/74
(58) Field of Classification Search ................... 439/70, 439/74, 66, 65, 71; 361/777, 775
See application file for complete search history.

(56) References Cited

U.S. PATENT DOCUMENTS

| 5,003,273 A * | 3/1991 | Oppenberg ..................... 333/1 |
| 5,381,596 A * | 1/1995 | Ferro ........................... 29/600 |
| 6,812,803 B2 | 11/2004 | Goergen |
| 7,152,319 B2 * | 12/2006 | Chan et al. .................... 29/852 |
| 2004/0150969 A1 | 8/2004 | Chan et al. |

FOREIGN PATENT DOCUMENTS

JP 2004-235629 1/2004

* cited by examiner

*Primary Examiner*—Phuong K Dinh
(74) *Attorney, Agent, or Firm*—Reed Smith LLP; Stanley P. Fisher, Esq.; Juan Carlos A. Marquez, Esq.

(57) ABSTRACT

In the case where high speed differential signals are transmitted in differential transmission lines through via holes with open-stubs, signal waveforms are distorted due to impedance mismatch in the open-stubs of the via holes, thus causing jitter, which has become an issue of high speed signals. For differential transmission lines that pass through via holes with open-stubs, a degree of coupling of the lines is decreased while the differential characteristic impedance is made constant. Thereby, the effects of backward cross talk noise caused by the coupling can be minimized, and thus jitter can be suppressed.

7 Claims, 12 Drawing Sheets

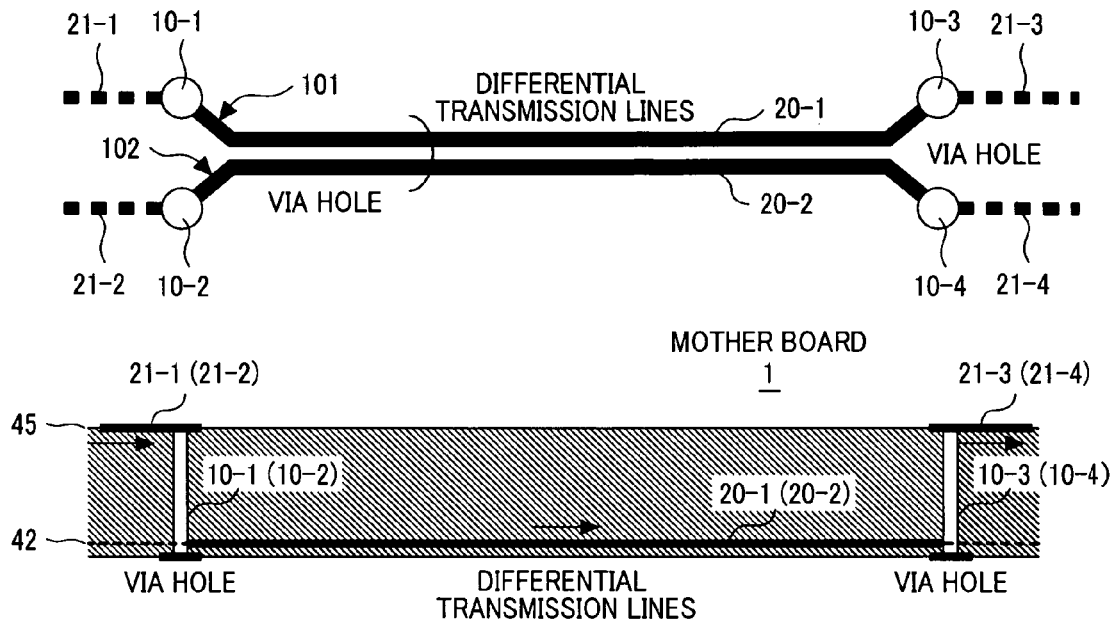
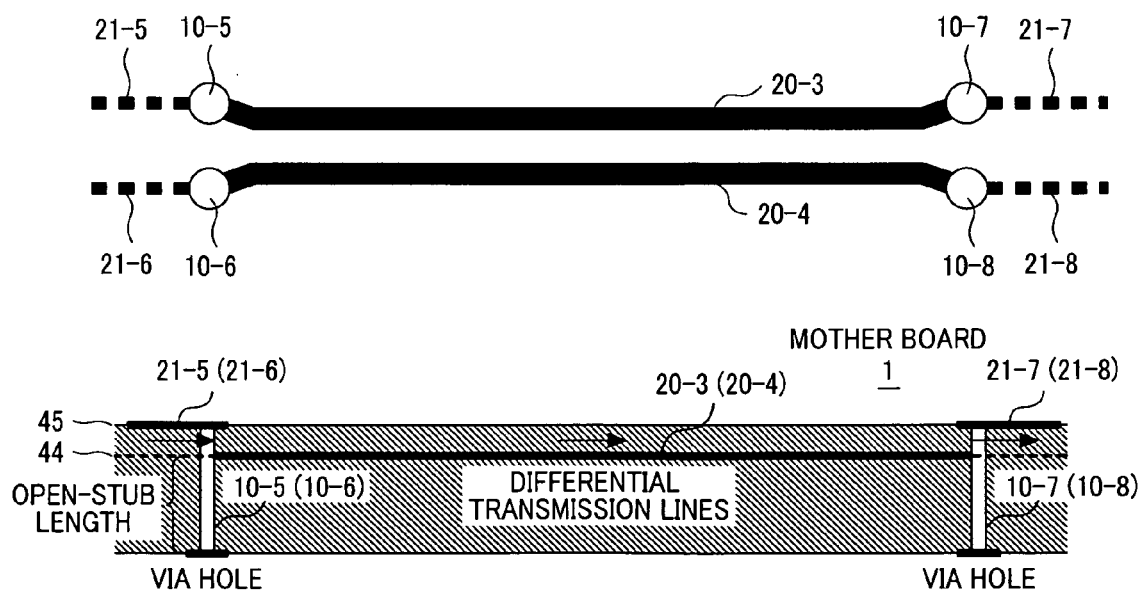

MULTILAYER PRINTED CIRCUIT BOARD FOR HIGH-SPEED DIFFERENTIAL SIGNAL, COMMUNICATION APPARATUS, AND DATA STORAGE APPARATUS

CLAIM OF PRIORITY

The present application claims priority from Japanese patent application Serial no. 2005-336725, filed on Nov. 22, 2005, the content of which is hereby incorporated by reference into this application.

BACKGROUND OF THE INVENTION

1. Field of the Invention

The present invention relates to a printed circuit board, a communication apparatus, and a data storage apparatus, and particularly to a printed circuit board suitable for forming differential signal paths thereon, and a communication apparatus and a data storage apparatus using the printed circuit board.

2. Description of the Related Art

As a method of transmitting a signal between LSIs, there is known a serial transmission in which information is transmitted and received by connecting the LSIs to each other with the use of differential transmission lines composed of two signal transmission lines. The transmission lines which are connected between the LSIs and which are arranged on a printed circuit board for serial transmission are normally arranged through holes that are called penetrating through holes or via holes. The number of via holes used for the signal transmission lines increases as the number of signal transmission lines for connecting between the LSIs increases.

The transmission lines arranged on different layers within the printed circuit board are mutually connected in an electrical manner through the via holes. However, in the case of high-speed signal transmission more than 1 GHz between the LSIs, the via hole itself causes the distortion of its waveform. The transmission lines on the printed circuit board configure transmission line paths called a stripline or a microstripline, and the characteristic impedance thereof can be easily kept constant. Irrespective of the fact, the distortion is caused due to difficulty of adjusting the impedance in the via holes to that of the transmission lines.

For the differential signal paths, a design policy called differential impedance is used in signal transmission. The characteristic impedance of wiring of a single-ended transmission line is defined by a ratio of propagation voltage to propagation current of a signal that is transmitted from the LSI. The characteristic impedance of the differential transmission lines is in relation to a propagation mode defined by directions of signals flowing in two transmission lines. In the case where polarities of signals between the two transmission lines are opposite to each other, it is called an odd mode. On the other hand, in the case where the signals are in phase, it is called an even mode. A differential impedance (Zdiff) and a common impedance (Zcom) with which the two transmission lines are terminated have relations of the following formulae.

$$Zdiff = 2 \cdot Zodd \quad (1)$$

$$Zcom = Zeven/2 \quad (2)$$

where the symbol · represents multiplication, Zodd represents the mode impedance of the odd mode, and Zeven represents the mode impedance of the even mode.

Since the polarities of signals in the differential transmission lines are always opposite to each other, if the two transmission lines are terminated with the differential impedance (Zdiff), the perfect matching condition of no reflection can be realized. For example, when two uncoupled transmission lines each having 50 Ω are prepared for differential signal transmission, the perfect matching condition that is in a no-reflection state is 100 Ω of the differential impedance (Zdiff) which is twice the characteristic impedance of a single-ended transmission line. In the case of coupled transmission lines, coupling of single-ended transmission lines each having a characteristic impedance of 55 Ω to 60 Ω allows the differential impedance to be lowered to 100 Ω.

As similar to the characteristic impedance of the single-ended transmission line, the differential impedance is determined roughly by the cross sectional shapes of the transmission lines. Specifically, the shapes imply a line width, a line thickness, the thickness of a dielectric layer, a relative permittivity of a dielectric material, and spacing between the transmission lines.

The differential impedance (Zdiff) has been mainly utilized for design of differential signals. This is because, if the differential impedance is constant throughout the system of the transmission line paths, it is considered as no reflection. Further, the differential signals have a characteristic of the common mode impedance (Zcom) of the in-phase propagation mode, and a wiring mode in which the differential impedance is constant but the common mode impedance is different is conceivable.

In the transmission pathways, since the cross sectional shapes of the transmission lines within the printed circuit board can be kept constant, the differential impedance can be constant. On the other hand, voltage and current of signals propagating through via holes are different from each other in movement. Although signal voltage propagates in the vertical direction with an assumption that the direction in which signals flow in the via holes is called vertical, the propagation voltage reaches throughout the via holes whereas the current flows only in a portion where the transmission lines are connected. For example, in the case of a via hole between the transmission lines connecting the uppermost layer and the lowermost layer in a multilayer printed circuit board, signal current flows throughout the via hole. However, in the case of a via hole connecting the uppermost layer and the second layer from the top (which is not the lowermost layer), propagation voltage reaches throughout the via hole. On the other hand, signal current does not flow throughout the via hole but between the uppermost layer and the second layer. This is because the latter requires less potential energy.

The pathways of voltage and current flowing in the via hole are different from each other. Accordingly, the impedance of the via hole changes depending on a wiring layer from which the transmission line is pulled out even if the via hole has a columnar shape, or clearances of a ground surrounding the via hole have the same structure. The impedance of the via hole does not match the characteristic impedance of the pulled-out transmission lines, so that reflection noise is generated due to impedance mismatch immediately before and after signals pass through the via hole. This impedance mismatch causes the distortion of a signal waveform due to the via hole.

A portion where current does not flow is called an open-stub. The open means disconnection, and the stub means a branch line. A portion except a pulled-out portion in the transmission line serves as a branch line, and an end of the transmission line except the pulled-out portion is an open end which is not connected, thus the portion is called open-stub.

As a method of solving the line distortion due to the via hole, there is a method of chipping off the open-stub portion of the via hole arranged in the printed circuit board. The method is called a back drill. The back drill is described in Japanese Patent Application Laid-Open No. 2004-235629 and "Design advances in PCB/backplane interconnects for the propagation of high speed signals", F. Gisin, et al., pp. 184-191 vol. 1, Digital Object Identifier 10.1109/TELSIKS. 2003.

However, the back drill is applied to each via hole including the open-stub, which increases the steps of preparing printed circuit boards and causes a rise in cost. Especially in a printed circuit board such as a mother board for a backplane bus, on which plural connectors are mounted, the number of via holes reaches from the thousands to the tens of thousands, which increases the cost of the back drill, and results in an increase of the cost of the apparatus.

The backplane bus is disclosed in U.S. Pat. No. 6,812,803.

SUMMARY OF THE INVENTION

An object of the present invention is to secure the characteristic of a high-speed signal without utilizing the back drill.

The degree of coupling between differential signal transmission lines is decreased by widening the line-spacing of the differential signal transmission lines that are connected to via holes, and jitter is accordingly decreased by decreasing the reflection of backward crosstalk due to an open-stub of a via hole. Therefore, the jitter can be suppressed to the same amount as that of a via hole with no open-stub.

The above-described object can be realized by a printed circuit board including: a first outer signal layer; a second outer signal layer; an inner signal layer; interlayer connecting via holes that penetrate from the first outer signal layer to the second outer signal layer; a first pair of differential transmission lines arranged on the first outer signal layer; a second pair of differential transmission lines arranged on the second outer signal layer; and a third pair of differential transmission lines arranged on the inner signal layer, wherein the first pair of differential transmission lines, the second pair of differential transmission lines, and the third pair of differential transmission lines are substantially the same in differential impedance, and the first pair of differential transmission lines is different from the third pair of differential transmission lines in line-spacing.

Further, the above-described object can be realized by a printed circuit board including: a first outer signal layer; a first inner signal layer that is located below the first outer signal layer; a second inner signal layer that is located below the first inner signal layer; a second outer signal layer that is located below the second inner signal layer; interlayer connecting via holes that penetrate from the first outer signal layer to the second outer signal layer; a first pair of differential transmission lines arranged on the first outer signal layer; a second pair of differential transmission lines arranged on the second outer signal layer; a third pair of differential transmission lines arranged on the first inner signal layer; and a fourth pair of differential transmission lines arranged on the second inner signal layer, wherein the first pair of differential transmission lines, the second pair of differential transmission lines, the third pair of differential transmission lines, and the fourth pair of differential transmission lines are substantially the same in differential impedance, and the line-spacing of the third pair of differential transmission lines is wider than that of the fourth pair of differential transmission lines.

Even in the case of differential signal transmission lines, the jitter is decreased by changing the degree of coupling in accordance with an open-stub length.

BRIEF DESCRIPTION OF THE DRAWINGS

FIG. 1 is a plan view and a cross sectional view of a printed circuit board having via holes with a short open-stub length;

FIG. 2 is a plan view and a cross sectional view of a printed circuit board having via holes with a long open-stub length;

DETAILED DESCRIPTION OF THE PREFERRED EMBODIMENTS

Figure 3:
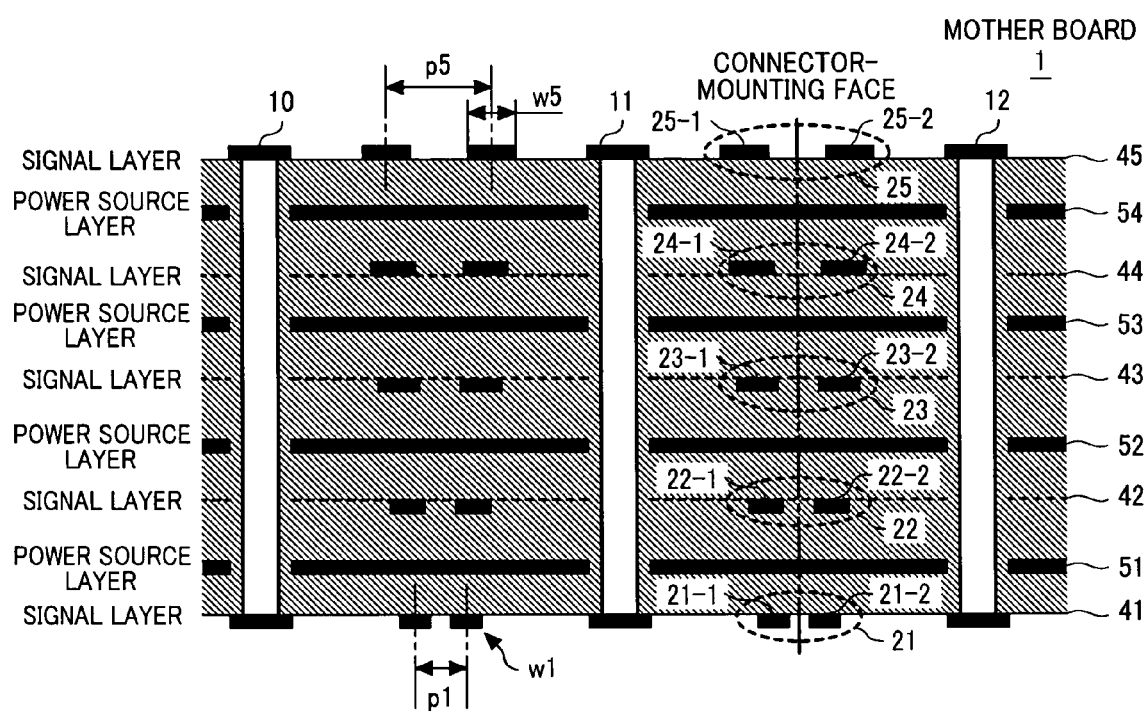
FIG. 3 is a sectional side view of a printed circuit board having layers, each having different line-spacing between transmission lines.

Embodiments will be described below in detail using examples while referring to the drawings. It should be noted that the identical elements are given the same reference number, and the explanation thereof will not be repeated.

First Embodiment

Figure 4:
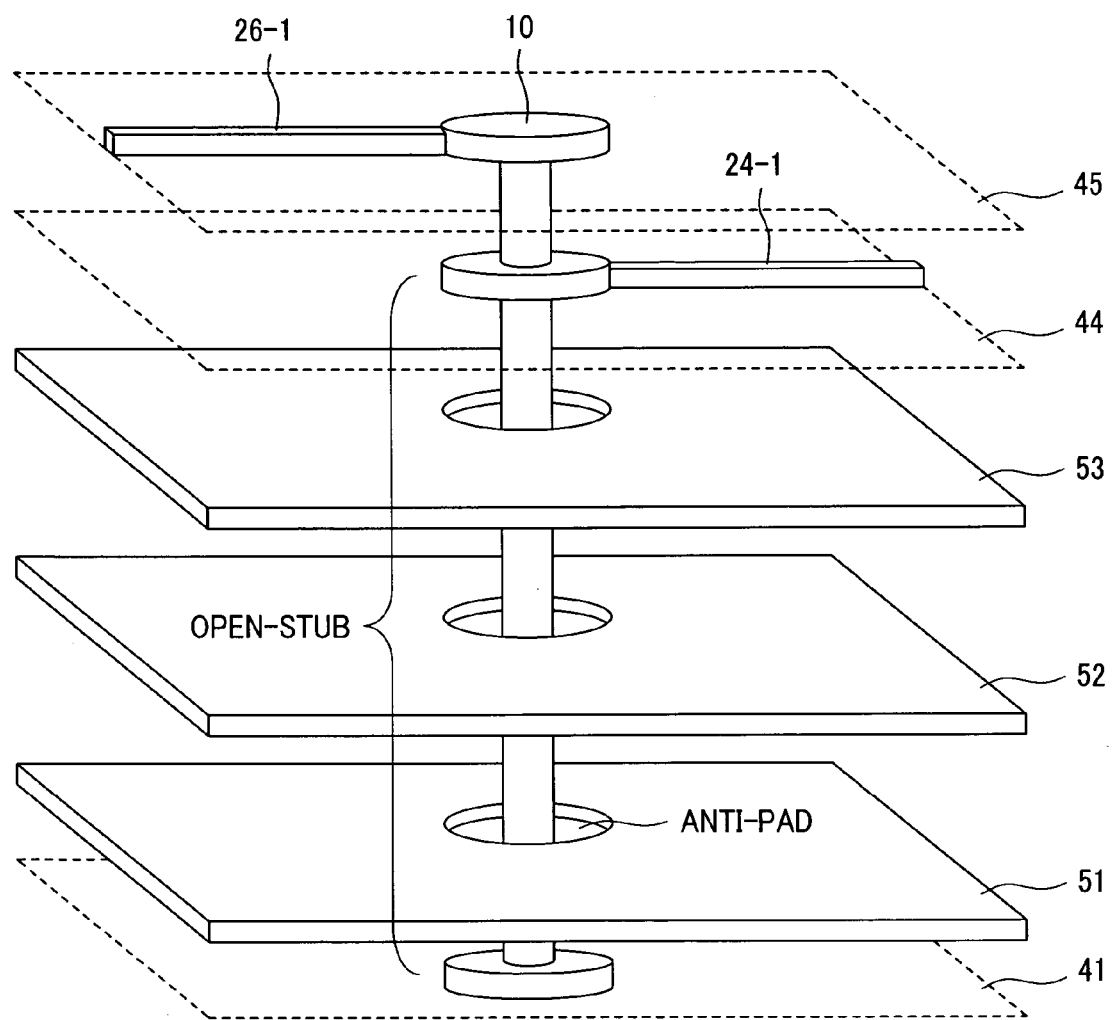
FIG. 4 is a bird's eye perspective view of a via hole with a long open-stub length.
Figure 5:
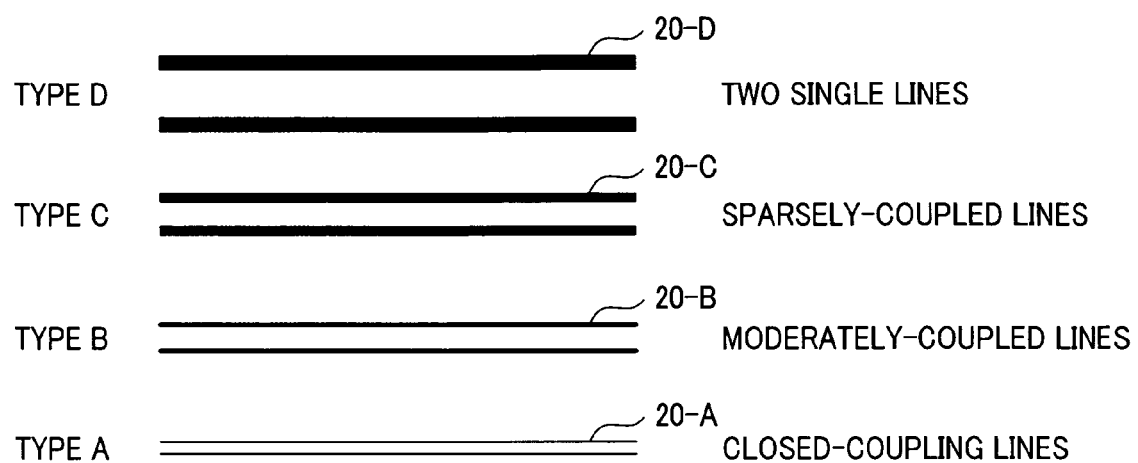
FIG. 5 is a diagram for explaining pairs of differential transmission lines, each pair having a different degree of coupling.
Figure 6:
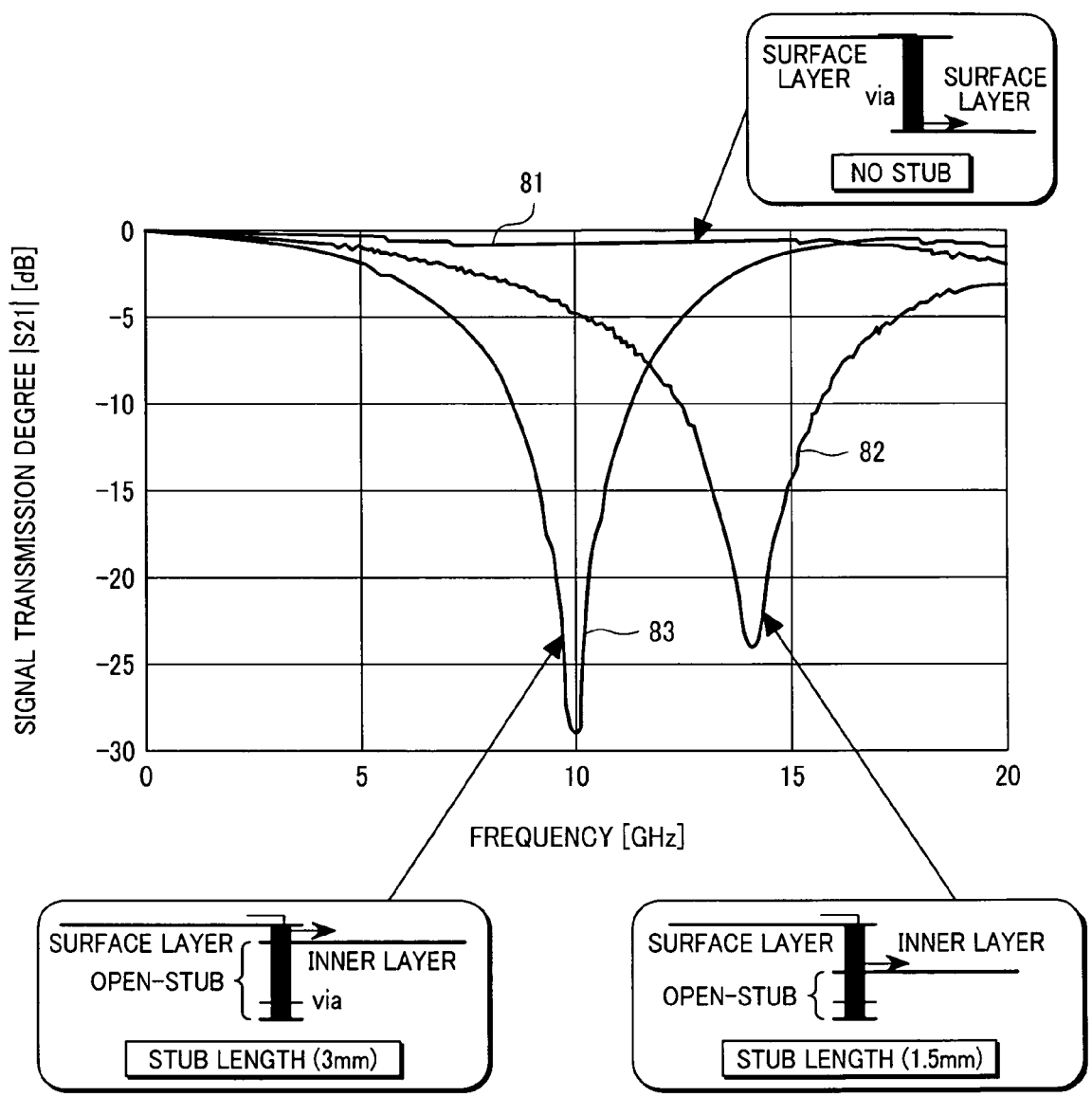
FIG. 6 is a diagram for explaining a signal propagation characteristic with an open-stub length as a parameter.
Figure 7:
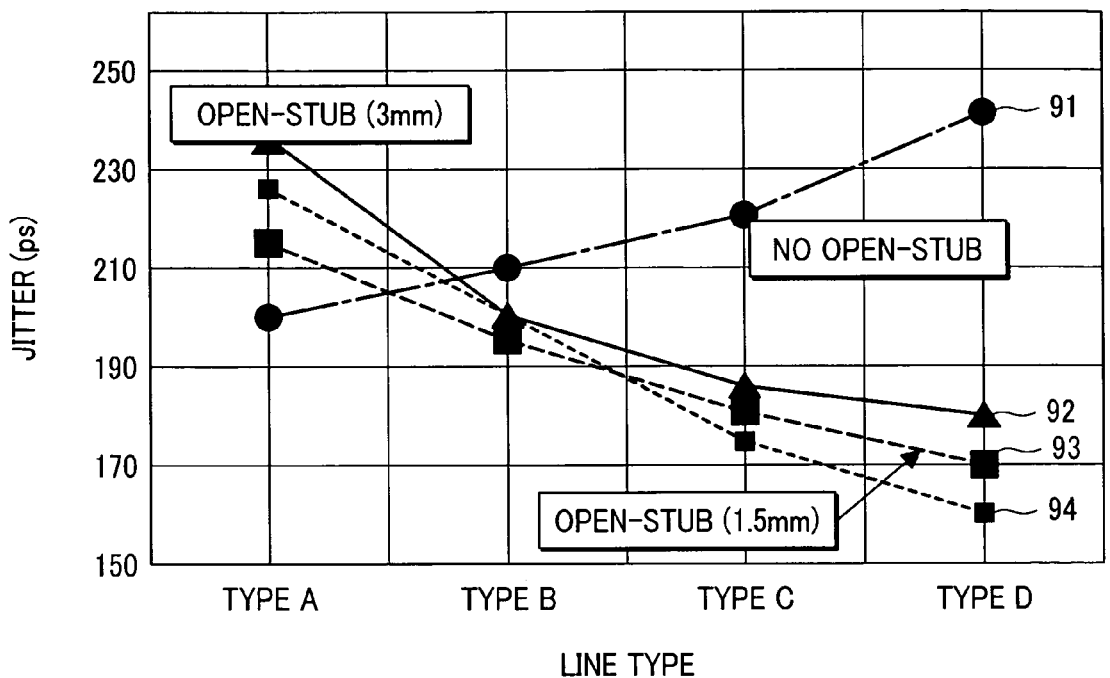
FIG. 7 is a diagram for explaining signal jitter caused by via holes with open-stub lengths and differential transmission lines each having different line-spacing.

The first embodiment will be described using FIGS. 1 to 7. FIG. 1 is a plan view and a cross sectional view of a printed circuit board having via holes with a short open-stub length. FIG. 2 is a plan view and a cross sectional view of a printed circuit board having via holes with a long open-stub length. FIG. 3 is a sectional side view of a printed circuit board having layers, each having different line-spacing between transmission lines. FIG. 4 is a bird's eye perspective view of a via hole with a long open-stub length. FIG. 5 is a diagram for explaining pairs of differential transmission lines, each pair having a different degree of coupling. FIG. 6 is a diagram for explaining a signal propagation characteristic with an open-stub length as a parameter. FIG. 7 is a diagram for explaining signal jitter caused by via holes with open-stub lengths and differential transmission lines each having different line-spacing.

In FIGS. 1 and 2, a multilayer mother board 1 includes penetrating through holes (hereinafter, referred to as via holes) 10 and differential signal transmission lines 20 and 21 that are pulled out from the via holes 10. It should be noted that the plan views of FIGS. 1 and 2 are ones of layers on which the differential transmission lines are formed.

As being apparent from the cross sectional views, the via holes 10 of FIGS. 1 and 2 penetrate the mother board 1 from the uppermost layer to the lowermost layer.

On an uppermost layer 45 of FIG. 1, there are arranged differential signal transmission lines 21-1 to 21-4 that are pulled out from via holes 10-1 to 10-4, respectively. Further, on an inner layer 42 of the mother board 1, there are arranged transmission lines 20-1 to 20-2.

In addition, on an uppermost layer 45 of FIG. 2, there are arranged differential signal transmission lines 21-5 to 21-8 that are pulled out from via holes 10-5 to 10-8, respectively. Further, on an inner layer 44 of the mother board 1, there are arranged transmission lines 20-3 to 20-4.

There are three points where FIG. 1 differs from FIG. 2.

The first point is that the inner layer of FIG. 1 on which the transmission lines are arranged is different from that of FIG. 2. Specifically, the transmission lines 20-1 and 20-2 are arranged on the inner layer 42 in FIG. 1 whereas the transmission lines 20-3 and 20-4 are arranged on the inner layer 44 in FIG. 2. As a result, the via holes 10-1 to 10-4 are different from the via holes 10-5 to 10-8 in open-stub length. The open-stub lengths of the via holes 10 are the same in each of FIGS. 1 and 2. However, the open-stub length in FIG. 1 is shorter that that in FIG. 2.

The second point is that line-spacing between the differential signal transmission lines in FIG. 1 is different from that in FIG. 2. The line-spacing between the transmission lines 20-1 and 20-2 in FIG. 1 is narrower than that between the transmission lines 20-3 and 20-4 in FIG. 2.

The third point is that line-widths of the differential signal transmission lines in FIG. 1 are different from those in FIG. 2. The line-widths of the transmission lines 20-1 and 20-2 in FIG. 1 are thinner than those of the transmission lines 20-3 and 20-4 in FIG. 2.

In the first embodiment, the thin transmission lines 20-1 and 20-2 with narrow line-spacing are combined with the via holes 10-1 to 10-4 in FIG. 1, each having a short open-stub length. On the other hand, the thick transmission lines 20-3 and 20-4 with wide line-spacing are combined with the via holes 10-5 to 10-8 in FIG. 2, each having a long open-stub length.

These are integrated and illustrated in FIG. 3. In FIG. 3, the mother board 1 is configured in such a manner that signal layers and power source/ground layers (hereinafter, referred to as power source layers) are alternately arranged. A signal layer 41, a power source layer 51, a signal layer 42, and a power source layer 52 are stacked in this order from the lowermost layer towards the upper layer side on the mother board 1. The uppermost layer is a signal layer 45. The mother board 1 is composed of five signal layers and four power source layers in the first embodiment. However, a mother board having more or less layers than the above-described numbers can be applied to a printed circuit board having two or more signal layers.

The via holes 10, 11, and 12 penetrate from the uppermost layer 45 to the lowermost layer 41 so as to be connected to transmission lines (not shown). A pair of differential signal transmission lines 21 on the signal layer 41 is composed of the transmission lines 21-1 and 21-2. As similar thereto, pairs of differential signal transmission lines 22 to 25 on the signal layers 42 to 45 are composed of a pair of transmission lines 22-1 and 22-2, a pair of transmission lines 23-1 and 23-2, a pair of transmission lines 24-1 and 24-2, and a pair of transmission lines 25-1 and 25-2, respectively.

As shown in FIG. 3, the widths of the differential transmission lines on each signal layer are represented by w1 to w5, and each line-spacing that is a distance between the centers of the transmission lines is represented by p1 to p5. The thicknesses of the transmission lines are the same on all the signal layers, and the differential impedance can be therefore designed by adjusting these w1 to w5 and p1 to p5. The degree of coupling can also be designed by adjusting these parameters. Each pair of differential transmission lines in FIG. 3 has substantially the same value of the differential impedance.

As the transmission lines are arranged upper, that is, from the signal layer 41 to the signal layer 45, each line-spacing of the pairs of differential transmission lines 21 to 25 becomes wider, which means p5>p4>p3>p2>p1. Further, as the transmission lines are arranged upper, that is, from the signal layer 41 to the signal layer 45, each line width of the pairs of differential transmission lines 21 to 25 becomes thicker, which means w5>w4>w3>w2>w1. The upper the pair of differential transmission lines is arranged, the longer the open-stub length is, and each pair of differential transmission lines 21 to 25 is connected to via holes (not shown). This open-stub length is equal to a distance from the signal layer 41 of the lowermost layer to the signal layer. The relation between the open-stub length of the via hole and the layer is described using FIG. 4.

Although a pair of differential transmission lines 24 is composed of the differential transmission lines 24-1 and 24-2, only the transmission line 24-1 is shown in FIG. 4. The transmission lines 26-1 and 24-1 which are respectively arranged on the signal layers 45 and 44 are connected to the via hole 10. However, the via hole 10 is not connected to the other signal layers and to any of the power source layers. Therefore, opening portions are formed around the via hole 10 in the power source layers 51 to 54 shown in FIG. 4. The opening portion is called an anti-pad. A signal flows in the transmission lines 26-1 and 24-1, and the via hole 10 from the signal layers 45 to 44, but does not flow in a portion of the via hole 10 below the signal layer 44. The portion below the signal layer 44 is called an open-stub as described above.

The degree of coupling of the pair of differential signal transmission lines will be described using FIG. 5. FIG. 5 illustrates pairs of differential signal transmission lines 20-A to 20-D, each pair having a different degree of coupling. The pair of differential signal transmission lines 20-A has narrow line-spacing, and is closed-coupling lines which are strongly coupled between the pair of lines. This closed-coupling lines is referred to as Type A. The pair of differential signal transmission lines 20-B has slightly-wider line-spacing and has a lower degree of coupling compared to the pair of differential signal transmission lines 20-A of Type A, but has a higher degree of coupling compared to the pair of differential signal transmission lines 20-C which is to be described later. This pair of lines 20-B is referred to as Type B of moderately-coupled lines. As similar thereto, the pair of differential signal transmission lines 20-C has much wider line-spacing than that of lines 20-B and is sparsely-coupled between them. This pair of lines is referred to as Type C. In the pair of differential signal transmission lines 20-D, the lines configuring a pair are sufficiently separated from each other, and the degree of coupling is low to the extent that the lines can be considered as two single-ended transmission lines. This pair of lines is referred to as Type D. All of these differential signal transmission lines have the same differential impedance (Zdiff).

A signal propagation characteristic of the via hole that connects the differential signal transmission lines between different wiring layers will be described using FIG. 6. FIG. 6 was obtained by analysis of electromagnetic fields. The vertical axis represents a degree of signal transmission, and the horizontal axis represents a frequency. In FIG. 6, there are written three waveforms 81, 82, and 83 that depend on the length of a stub. The waveform 81 represents the transmission characteristic of the via hole from the transmission lines on the wiring layer 45 to the transmission lines on the wiring layer 41 in FIG. 3, and the signal thereof hardly attenuates at any frequencies. The waveform 82 represents the transmission characteristic (band cut characteristic) of the via hole from the transmission lines on the wiring layer 41 to the transmission lines on the wiring layer 43, and has an area around 14 GHz where a signal is hardly transmitted. Further, the waveform 83 represents the transmission characteristic of the via hole from the transmission lines on the wiring layer 41 to the transmission lines on the wiring layer 44, and it can be found that no signal is transmitted around 10 GHz. In the analysis of FIG. 5, the thickness of the printed circuit board is 3.0 mm, the via hole represented by the waveform 81 has no open-stub length, the via hole represented by the waveform 82 has an open-stub length of 1.5 mm, and the via hole represented by the waveform 83 has an open-stub length of 3.3 mm. The result shows that the open-stubs resonate at frequencies where the transmission characteristics are deteriorated among these waveforms.

As described above, the transmission characteristic of the via hole shows the resonant frequency and the band cut frequency due to the open-stub length, and the longer the open-stub length is, the lower the center frequency is shifted. Therefore, the longer the open-stub length is, the more a pulse characteristic around a few GHz is deteriorated.

There will be described the amount of jitter using FIG. 7 in the case where the via holes each having a different open-stub length are combined with the pairs of differential signal transmission lines of Types A to D in which the degree of coupling is changed. Here, the vertical axis represents the whole ranges of total jitter in the case of superimposing the backgrounds 50000 times, and 2 Gbits/s signals having pseudorandom rectangular waveforms are input. The horizontal axis represents the line types A to D corresponding to the pairs of transmission lines 20-A to 20-D, respectively, in FIG. 5.

FIG. 7 shows actual measurements of jitter in transmission pathways through three differential transmission lines and two via holes, and the line structure is shown as FIG. 1. The transmission lines is routed as transmission lines 21—via holes 10-½—transmission lines 20—via holes 10-¾—transmission lines 21. The two transmission lines 21 have a short length of 150 mm. For the transmission lines 20, a line system having a length of 1 m was used in the experiment.

FIG. 7 represents waveforms 91 to 94. Among the four waveforms, signal pathways are the same with the exceptions of the wiring layers 42 and 43, or the wiring layer 43 in FIG. 3 in the wiring structures between two via holes. These are the line types A to D mounted on these wiring layers. The transmission lines 21 on the wiring layer 45 have the same line structure in length, width, and space.

The waveform 91 represents the jitter of the signal transmission from the wiring layer 45 to the wiring layer 41 through the via holes with no open-stubs. It can be found that as the degree of coupling of the transmission lines becomes higher, the jitter of the waveform 91 is decreased. That is, the jitter is decreased in the order of the wiring types D to A. The waveform 91 represents the jitter of the signal transmission in the wiring of the wiring layers 45 and 41, and these layers are surface layers, which are therefore called microstriplines.

On the other hand, the waveforms 92, 93, and 94 represent the jitter of the signal transmission on the wiring layer 44 through the via hole with an open-stub length of 3 mm, the wiring layer 43 through the via hole with an open-stub length of 1.5 mm, and the wiring layer 42 through the via hole with an open-stub length of 0.4 mm. In these waveforms, long signal transmission lines are disposed on inner layers, and the wiring on the inner layers is called a stripline. In contrast to the waveform 91, it can be found from the waveforms 92, 93, and 94 that as the degree of coupling of the transmission lines becomes lower, the jitter is decreased. That is, the jitter is decreased in the order of the wiring types A to D.

As described above, it can be found that the amount of jitter differs depending on the degree of coupling of the transmission lines even if the same via holes with a constant open-stub length are used, which clarifies that the trend is opposite between the stripline structure and the microstripline structure.

This phenomenon can be conceived as follows. The backward crosstalk occurs between the coupled transmission lines in both of the stripline structure and the microstripline structure. The backward crosstalk is characterized in that its coefficient (Kb) is always positive. As is well known in the art, in two coupled-lines that are perfectly terminated at both ends, when a rectangular-shaped signal (Vin) is input to one end of one transmission line, a backward crosstalk voltage (Vb) that is generated at a front end of the other transmission line can be obtained from the following formula.

$$Vb = Kb \cdot Vin \quad (3)$$

Here, the "backward" means the opposite direction with respect to the signal transmission of a drive line, and Vb shows a point at a rear end. Kb can be obtained from the following formulae when the loss is vanishingly small with a backward crosstalk coefficient. Further, the differential impedance (Zdiff) and the common impedance (Zcom), or the even mode impedance (Zeven) and the odd mode impedance (Zodd) have the relation of the following formulae.

$$Kb = (Cm/Co + Lm/Lo)/4 \quad (4)$$
$$= 1/2 \cdot (Zeven - Zodd)/Zeven + Zodd)$$
$$= 1/2 \cdot (4Zcom - Zdif)/(4Zcom + Zdif) \quad (5)$$

Here, Cm and Co represent a mutual capacitance and a self-capacitance of a transmission line per unit of length, respectively. Lm and Lo represent a mutual inductance and a self-inductance of a transmission line per unit of length, respectively. When Vin takes a rectangular shape, Vb is equal to a delay time in reciprocating propagation along the coupling length of the coupled-lines.

Irrespective of the stripline structure and the microstripline structure, the backward crosstalk coefficient (Kb) is positive, and Kb that is the degree of coupling can be changed by changing the common mode impedance while keeping the differential impedance constant. As shown by the waveforms 92, 93, and 94 in FIG. 7, the higher the degree of coupling of the lines is, that is, the larger the absolute value of the backward crosstalk coefficient is, the larger the jitter is. The reason is that in the case of differential signals, signals having signs opposite to each other always propagate in the two coupled-lines, and the backward crosstalk of one signal affects the other signal due to the coupling of the lines. This is because the backward crosstalk coefficient (Kb) is positive, and the backward crosstalk from one signal to the other signal therefore has a sign opposite to the polarity of the other signal. Since the backward crosstalk is superimposed on the other signal by being reflected at an impedance mismatching point such as a via hole, a moderate waveform due to resistance components and conductance components of the transmission lines becomes more moderate. Therefore, the longer the open-stub length is, the larger the jitter is, and the higher the degree of coupling of two lines is, the larger the jitter is in FIG. 7.

As the transition time of a waveform becomes longer, that is, as the rise time and the fall time are longer, the jitter is increased due to effects of random noise. It is therefore conceivable that the jitter is increased due to the moderate waveform by reflection of the backward crosstalk.

In the first embodiment, the decrease of the jitter is utilized by uncoupling between the differential transmission lines.

From the result of the above experiment, in the case where the transmission lines are pulled out from the wiring layer 45 through the via holes with the open-stubs as shown in FIG. 3, the line spacing of the closed-coupling lines on the rear face of the wiring layer 41 is made narrower, and the line-spacing is made wider in accordance with the open-stub length for the upper wiring layer which has a longer open-stub length, so that transmission pathways with the small and same amount of jitter can be established in every wiring layer. As a result, the wiring structure contributes to high-speed, and in addition, has an advantageous effect that decreases the number of designing steps from the point of view of characteristics matching.

Second Embodiment

Figure 8:
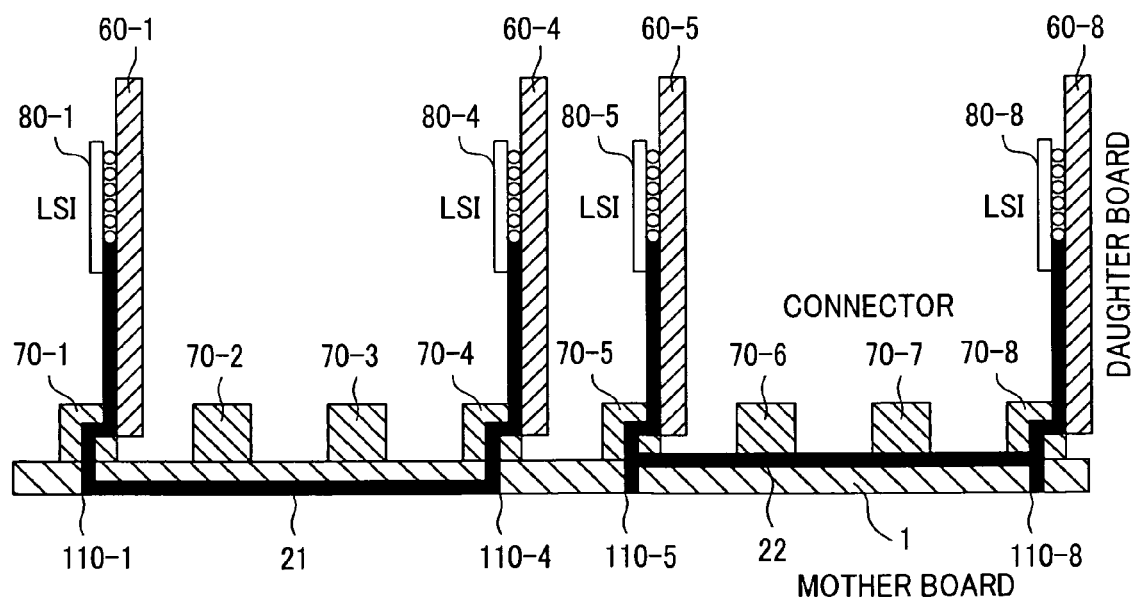
FIG. 8 is a plan view of plural printed circuit boards configuring a backplane bus.
Figure 9:
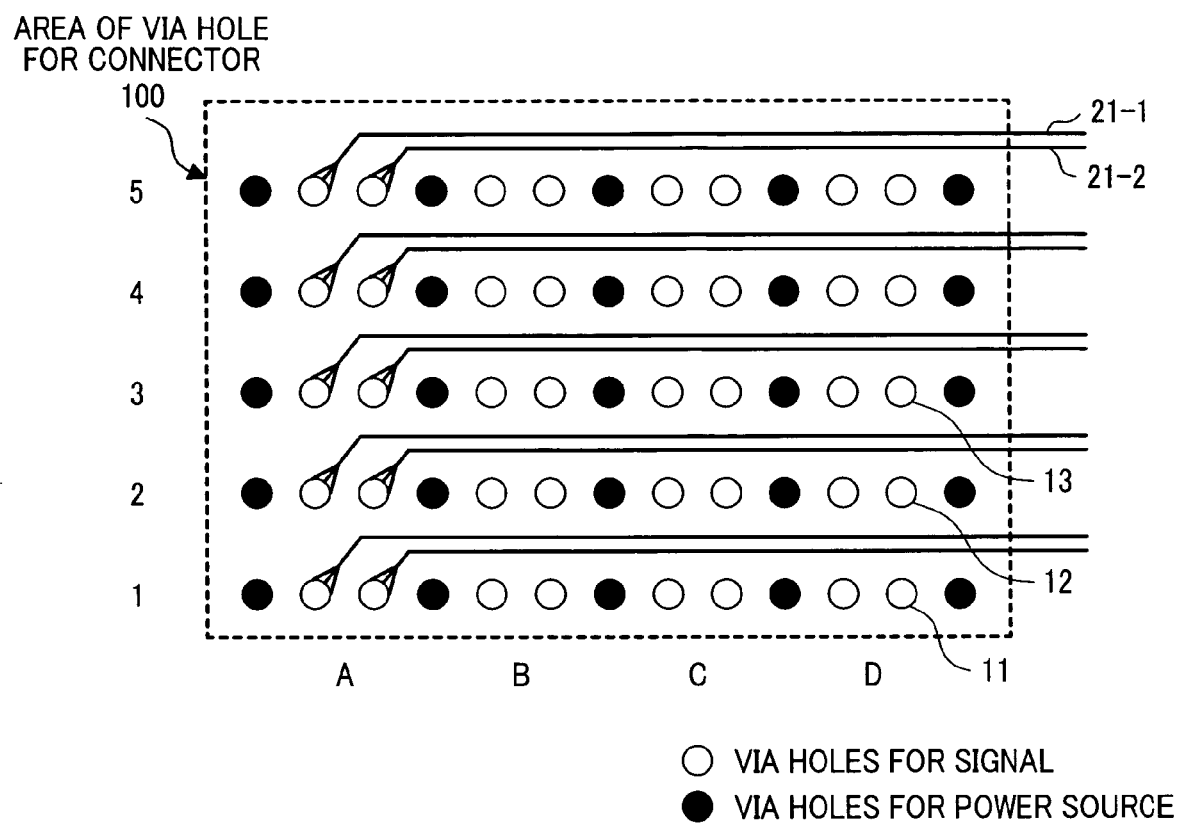
FIG. 9 is a diagram for explaining a wiring structure (closed-coupling lines) of a connector portion.
Figure 10:
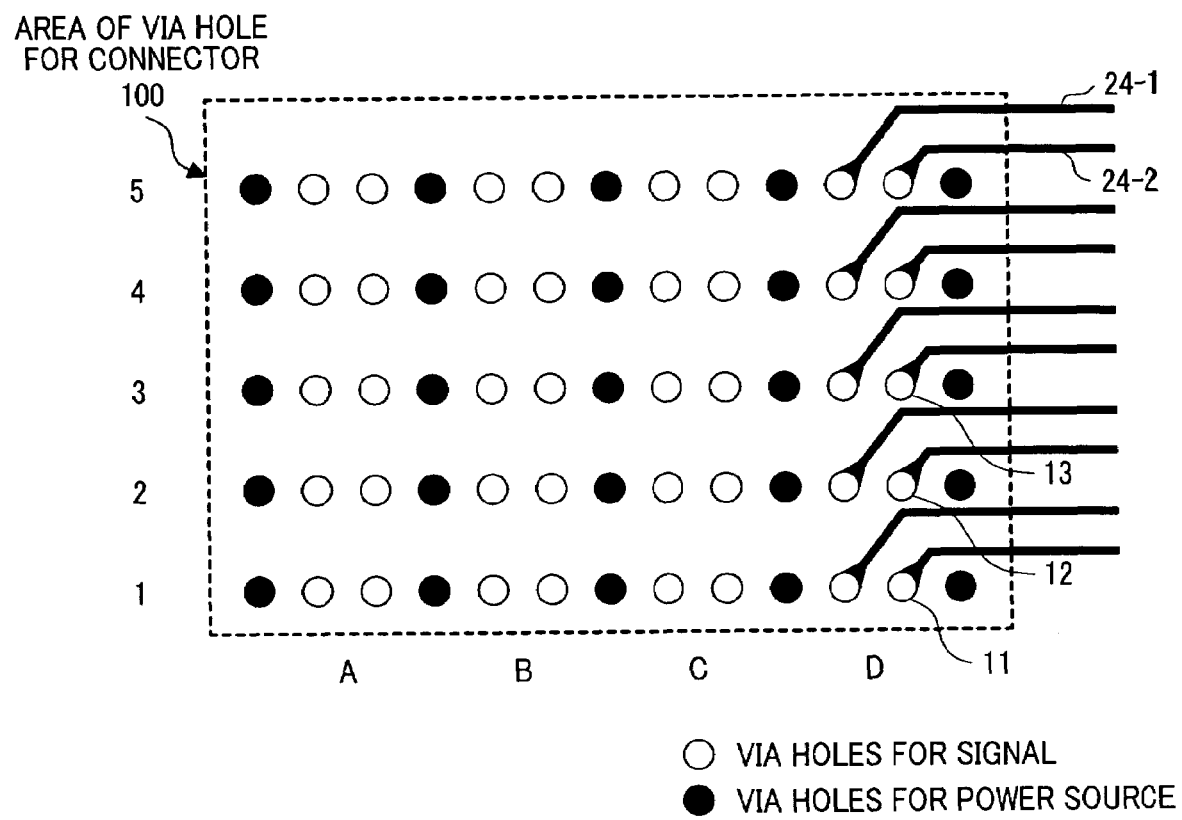
FIG. 10 is a diagram for explaining a wiring structure (sparsely-coupled lines) of the connector portion.
Figure 11:
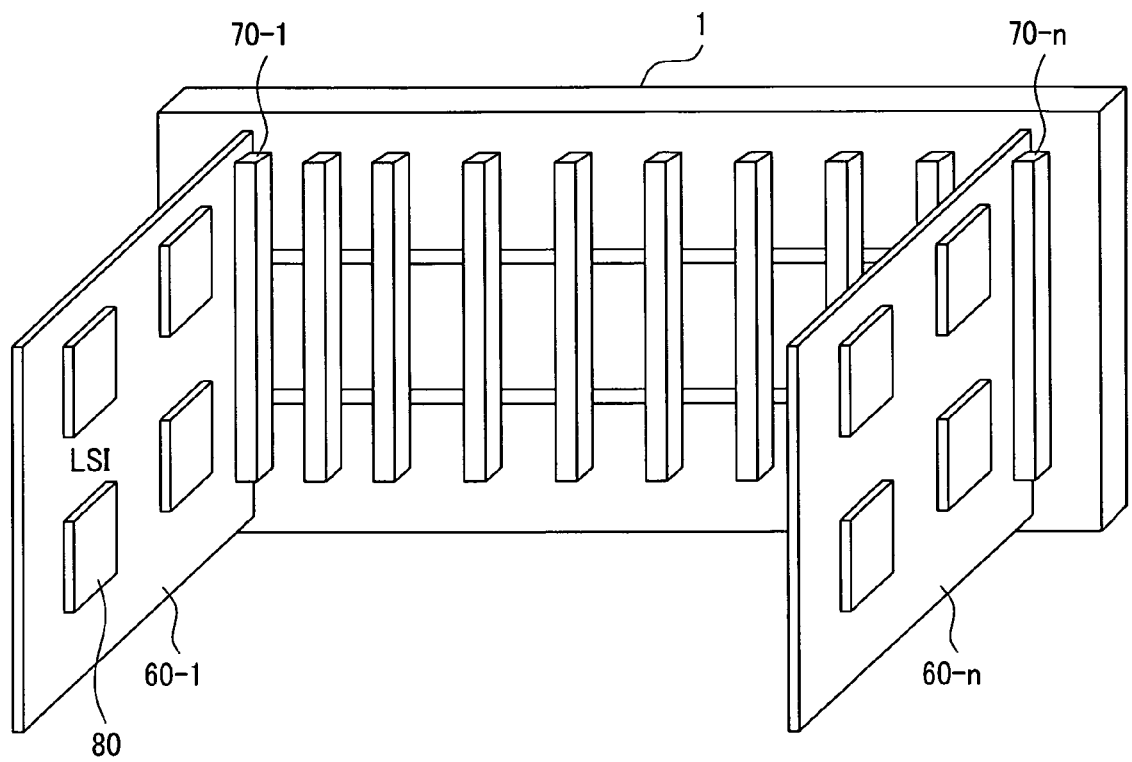
FIG. 11 is a bird's eye view of plural printed circuit boards configuring a backplane bus.

The second embodiment will be described using FIGS. 8 to 11. In the second embodiment, the structure of the differential signal transmission lines in the first embodiment is applied to a backplane bus. FIG. 8 is a plan view of plural printed circuit boards configuring a backplane bus. FIGS. 9 and 10 are diagrams for explaining wiring structures of connector portions. FIG. 11 is a bird's eye view of plural printed circuit boards configuring a backplane bus.

As being apparent with reference to FIG. 11, connectors 70-1 to 70-8 are mounted on a mother board 1 in FIG. 8. Daughter boards can be inserted and mounted to the connectors 70-1 to 70-8. In FIG. 8, the daughter boards 60-1, 60-4, 60-5, and 60-8 are inserted to the connectors 70-1, 70-4, 70-5, and 70-8, respectively. FIG. 8 illustrates eight connectors whereas FIG. 11 illustrates connectors of more than eight. However, the number is not essential so that the connectors are represented by 70-n in FIG. 11. On each daughter board, a semiconductor (LSI) for realizing a function is mounted, and transmission and reception of data is performed between the LSIs through a backplane bus.

In FIG. 8, an LSI 80-1 mounted on the daughter board 60-1 transmits and receives data to/from an LSI 80-4 mounted on the daughter board 60-4 through the connectors 70-1, 70-4, and the differential signal transmission lines 21 within the mother board 1. As similar thereto, an LSI 80-5 transmits and receives data to/from an LSI 80-8 through the connectors 70-5, 70-8, and differential signal transmission lines 22.

Via holes 110-1 and 110-4 are respectively located at both ends of the transmission lines 21, and via holes 110-5 and 110-8 are respectively located at both ends of the transmission lines 22. Only two transmission lines 21 and 22 are illustrated in FIG. 8, however, an actual board includes plural lines having different line-lengths on different layers.

In a backplane bus, the number of daughter boards to be mounted is large, which results in the large number of lines for connecting between the daughter boards. Therefore, even for the same wiring between the daughter boards, the wiring requires plural layers. The mother board 1 has a wiring structure as shown in FIG. 3. Specifically, the line-spacing differs depending on the open-stub length.

In FIG. 8, the transmission lines 21 are arranged on the lowermost layer, and the transmission lines 22 are arranged on the uppermost layer of the inner layer as an example. Therefore, the via holes at both ends of the differential signal transmission lines 21 of the microstripline have no open-stubs, but the via holes at both ends of the differential signal transmission lines 22 of the stripline have long open-stubs. Therefore, signals passing through the differential signal transmission lines 22 cause distortion due to the open-stubs, however, the line-spacing of the differential signal transmission lines 22 is wide as similar to 20-D in FIG. 5. As a result, even in the case of the long open-stubs as shown in FIG. 7, the jitter can be minimized. On the other hand, for the differential signal transmission lines 21, the jitter can be minimized by employing Type A as similar to 20-A.

The line-spacing of the differential signal transmission lines 21 and 22 depends on the open-stub lengths of the via holes at the both ends. However, in the case where faces on which the connectors 70-1 to 70-8 are mounted are on only one side of the mother board 1, a signal wiring layer closer to the surface layer on the connector-mounted side has longer open-stub lengths of the via holes. Therefore, if a wiring layer for connecting the connector-mounted face and the connectors is determined, the open-stub length of a via hole is uniquely determined. The line-spacing of the differential transmission lines can also be uniquely determined.

The pulling out of the transmission lines in this case will be described with reference to FIGS. 9 and 10. The via holes for connectors are within a range represented by a dotted line 100 in FIGS. 9 and 10. Black circles represent via holes for power source and white circles represent via holes for signal. Since the differential transmission lines make a pair, two lines are pulled out as one pair. Pin numbers that indicate positions are allocated in the area 100 of via holes for connectors. The horizontal row is represented by A, B, C and D, and the vertical row is represented by 1, 2, 3, 4 and 5. Differential signals are allowed to pass through from the row A to the row B with two via holes as one bit. The via holes for power source sandwich the both sides of the via holes of the differential signal transmission lines in order to decrease the crosstalk between the via holes.

FIG. 9 shows a wiring structure in which the transmission lines are pulled out from the row A of the via holes for connector, and FIG. 10 shows a wiring structure in which the transmission lines are pulled out from the row B of the via holes for connector. The differential signal lines 21-1 and 21-2 in FIG. 9 have the same width and space from the first row to the fifth row. As similar thereto, the differential signal lines 24-1 and 24-2 in FIG. 10 also have the same width and space from the first row to the fifth row. However, the pair of transmission lines 21-1 and 21-2 is different from the pair of transmission lines 24-1 and 24-2 in wiring layer and line-spacing. The transmission lines 21-1 and 21-2 in FIG. 9 are arranged on the wiring layer apart from the connector-mounted face, that is, the signal layer 41 in FIG. 3. The transmission lines 24-1 and 24-2 in FIG. 10 are arranged on the signal layer 44.

The transmission lines 21-1 and 21-2 in FIG. 9 and the transmission lines 24-1 and 24-2 in FIG. 10 are wired as pairs of differential transmission lines at a space between pins of the connectors. In the case where the line-spacing in FIG. 10 is wide, the wiring density is decreased. Even in this case, the transmission lines can be wired as long as two transmission lines can pass through between the pins of the connectors. Therefore, the wiring density of the two transmission lines between the pins remains unchanged even in the case of narrow line-spacing of the differential transmission lines, so that the wiring density is constant throughout the mother board 1 of the backplane bus.

In the mother board 1 in FIG. 8 or 11, the wiring as shown in FIGS. 9 and 10 allows for constant line-spacing of a pair of differential transmission lines between connectors even on a mother board on which plural connectors are mounted and a back drill is not used, and even for differential signal transmission lines having different line-spacing. Therefore, as similar to the effects of the first embodiment, the jitter due to the effects of the open-stubs of the via holes can be decreased.

Third Embodiment

Figure 12:
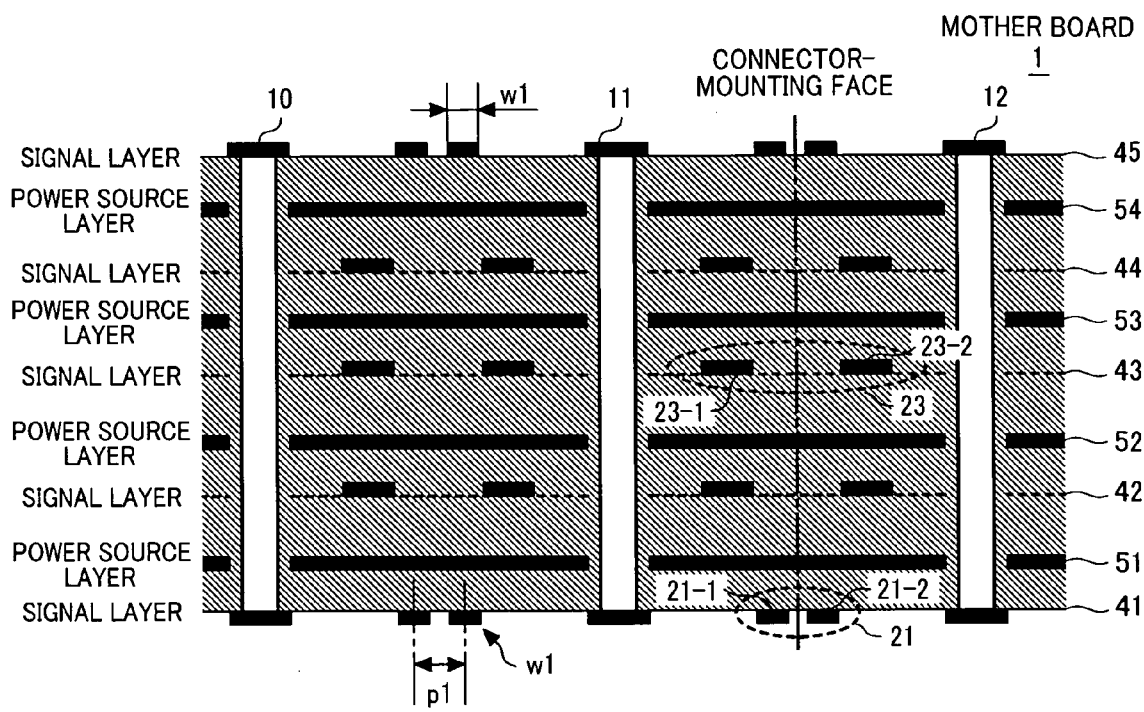
FIG. 12 is a cross sectional view of a multilayer printed circuit board.

The third embodiment will be described using FIG. 12. FIG. 12 is a cross sectional view of a multilayer printed circuit board.

On the mother board 1 shown in FIG. 3, the striplines of the inner layers 42 to 44 are composed of two single-ended transmission lines 23-1 and 23-2 having an extremely low degree of coupling, that is, wide line-spacing, and strongly-coupled microstriplines 21-1 and 21-2 are arranged on the outer layers 41 and 45. All the transmission lines have the same differential impedance.

The waveform 91 in FIG. 7 represents the jitter in a system in which the wiring of the microstrip structure is connected to via holes with no open-stub lengths. Here again, it can be found that the jitter of the waveform 91 is decreased as the degree of coupling of the transmission lines becomes higher, that is, in the order of the wiring type D to A. The waveform 91 is obtained from the wiring of the wiring layers 45 and 41 in FIG. 3. Since these layers are surface layers, the wiring thereof is called a microstripline.

The decrease of jitter of this microstripline can be conceived as follows. That is, in the wiring of the stripline structure, the signal transmission lines are surrounded above and below by the power source layers. Further, an insulating material is filled between the power source layers. Therefore, the propagation speed of a signal flowing in this stripline is constant, so that no forward crosstalk occurs. In contrast thereto, in the microstripline structure, the signal transmission lines are sandwiched by a ground layer from one side and an air layer from the other side, so that the forward crosstalk occurs between the coupled transmission lines. This is because the speed of an electrical field that flows in the air layer is faster than one that flows in the ground side. This speed is inversely proportional to the square root of the dielectric constant of a medium in which an electrical field progresses. Accordingly, the dielectric constant (εr) of air is 1 whereas the dielectric constant (εr) of a printed circuit board composed of FR-4 is about 4, which is only half the speed of air. Due to this, the forward crosstalk coefficient Kf in the microstripline is anything but 0. In addition, the forward crosstalk coefficient (Kf) becomes positive or negative depending on the wiring structure.

As is well-known in the art, in two coupled-lines that are perfectly terminated at both ends and have the microstripline structure, when a rectangular-shaped signal (Vin) is input to one end of one transmission line, a forward crosstalk voltage (Vf) that is generated at a front end of the other transmission line can be obtained from the following formula.

$$Vf = Kf \cdot l \cdot d(Vin)/dt \quad (6)$$

Here, the "forward" means a point in the progressing direction with respect to the signal propagation, and Kf represents a forward crosstalk coefficient, l represents the length of the coupled transmission lines, and d/dt represents the differential symbol of time. Further, the forward crosstalk coefficient Kf can be obtained from the following formula when the loss is vanishingly small. When Vin is a rectangular wave, Vf takes a peak waveform because Vf can be given by temporal differentiation of Vi.

$$Kf = (Cm/Co - Lm/Lo)/(2Vp) \quad (7)$$

Here, Cm and Co represent a mutual capacitance and a self-capacitance of a transmission line per unit of length, respectively. Lm and Lo represent a mutual inductance and a self-inductance of a transmission line per unit of length, respectively. Vp is a propagation delay speed.

In the case of the microstripline structure, the sign becomes opposite depending on the magnitude between the ratio of Cm/Co and the ratio of Lm/Lo. When Kf is negative, the jitter is decreased as the coupling strength is higher as shown by the waveform 91 in FIG. 7, that is, when the forward crosstalk coefficient is negative and as the absolute value is larger. Because, in the case of the differential signals, signals having signs opposite to each other propagate in two coupled transmission lines. The forward crosstalk of one signal affects the other signal due to the coupling of the lines. When the forward crosstalk coefficient (Kf) is negative, the polarity of the forward crosstalk from one signal to the other signal is the same as that of the other signal. Therefore, since the peak forward crosstalk is superimposed on the other signal, transition portions (rising edge and falling edge) of a moderate waveform caused by resistance components and conductance components are changed from a moderate state to a steep state.

As the transition time of a waveform becomes longer, that is, as the rise time and the fall time are longer, the jitter is increased due to effects of random noise. It is conceivable that the jitter is decreased because the forward crosstalk raises the moderate waveform into the steep waveform.

It is the third embodiment that utilizes the decrease of jitter. The microstripline of the third embodiment has a negative forward cross talk coefficient Kf, and its absolute value is large. The degree of coupling in the stripline on the inner layer is extremely low, which is in contrast to the microstripline.

With the structure as described above, the striplines on the inner layers 42 to 44 allow the jitter to be minimized irrespective of the open-stub lengths of the via holes as similar to Type D in FIG. 7. Further, the microstriplines on the outer layers 41 and 45 also allow the jitter to be minimized as similar to Type A. Since two differential transmission lines can be wired on any layers between the via holes 10, 11, and 12, the wiring on the printed circuit board as shown in FIGS. 9 and 10 can be realized. Accordingly, the wiring density of the two transmission lines between the pins remains unchanged irrespective of narrow or wide line-spacing of the differential transmission lines, so that the wiring density is constant throughout the mother board 1 of the backplane bus.

Fourth Embodiment

Figure 13:
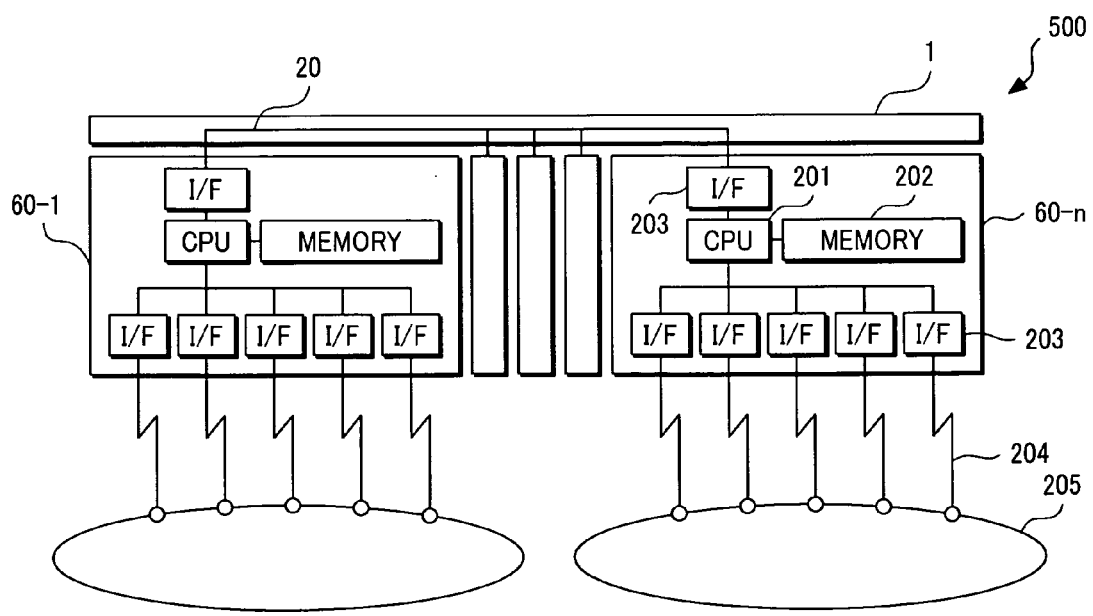
FIG. 13 is a block diagram of a router connected to wide area networks.

The fourth embodiment will be described using FIG. 13. FIG. 13 is a block diagram of a router which is connected to wide area networks. In the fourth embodiment, the mother board in the second embodiment is applied to a packet transferring apparatus that is a communication apparatus.

In FIG. 13, modules 60-1 to 60-n are connected to a mother board 1 through transmission lines 20. The mother board 1 allows the jitter of a signal to be decreased by differential signal transmission lines (not shown) whose line-spacing is controlled.

The module 60 includes a processor 201, a memory 202, and plural interface circuits 203 from which the module 60 is connected to the wide area networks 205 through cables 204. The interface circuits 203 receive data through the cables 204, and the CPU 201 computes to which network the data is transferred with the use of the header of the data. The data is then transmitted in the transmission lines on the mother board 1 in such a manner that the data can be reached to the interface circuits 203 in the corresponding module. High throughput data can be transmitted thanks to little jitter of a signal on the mother board 1.

Fifth Embodiment

Figure 14:
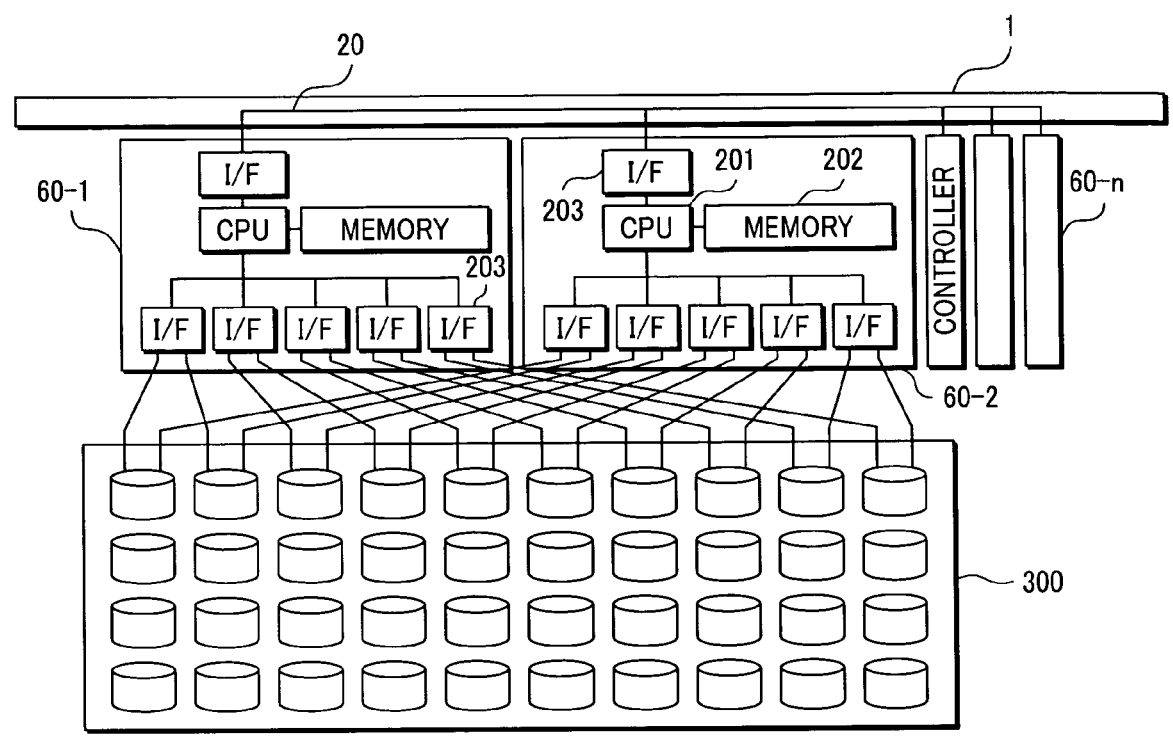
FIG. 14 is a block diagram of a RAID system.

The fifth embodiment will be described using FIG. 14. Here, FIG. 14 is a block diagram of a RAID system. Further, in the fifth embodiment, the mother board in the second embodiment is applied to a RAID system that is a data storage apparatus.

Where FIG. 14 differs from FIG. 13 in the fourth embodiment is that the modules 60-1 to 60-n are connected to a hard disk array (HDD array) 300, and the HDD array 300 is doubly connected the modules 60-1 to 60-2 so as to enhance the reliability.

The modules 60-1 and 60-2 are connected to the mother board 1 through transmission lines 20. The mother board 1 allows the jitter of a signal to be decreased by differential signal transmission lines (not shown) whose line-spacing is controlled.

The module 60 includes a processor 201, a memory 202, and plural interface circuits 203 from which the module 60 is connected to the HDD or an outer storage apparatus 301.

Data can be read and written from/into the HDD array 300 with a high speed through modules that are allocated to the modules 60-1 to 60-n and are communicated with the host side. At this time, the CPU 201 or another module computes redundant bits from the data, and computes in which HDD the data should be stored. The data is then transmitted in the transmission lines 20 on the mother board 1 in such a manner that the data can be reached to the interface circuits 203 in the corresponding module. High throughput data can be transmitted thanks to little jitter of a signal on the mother board 1.

Sixth Embodiment

Figure 15:
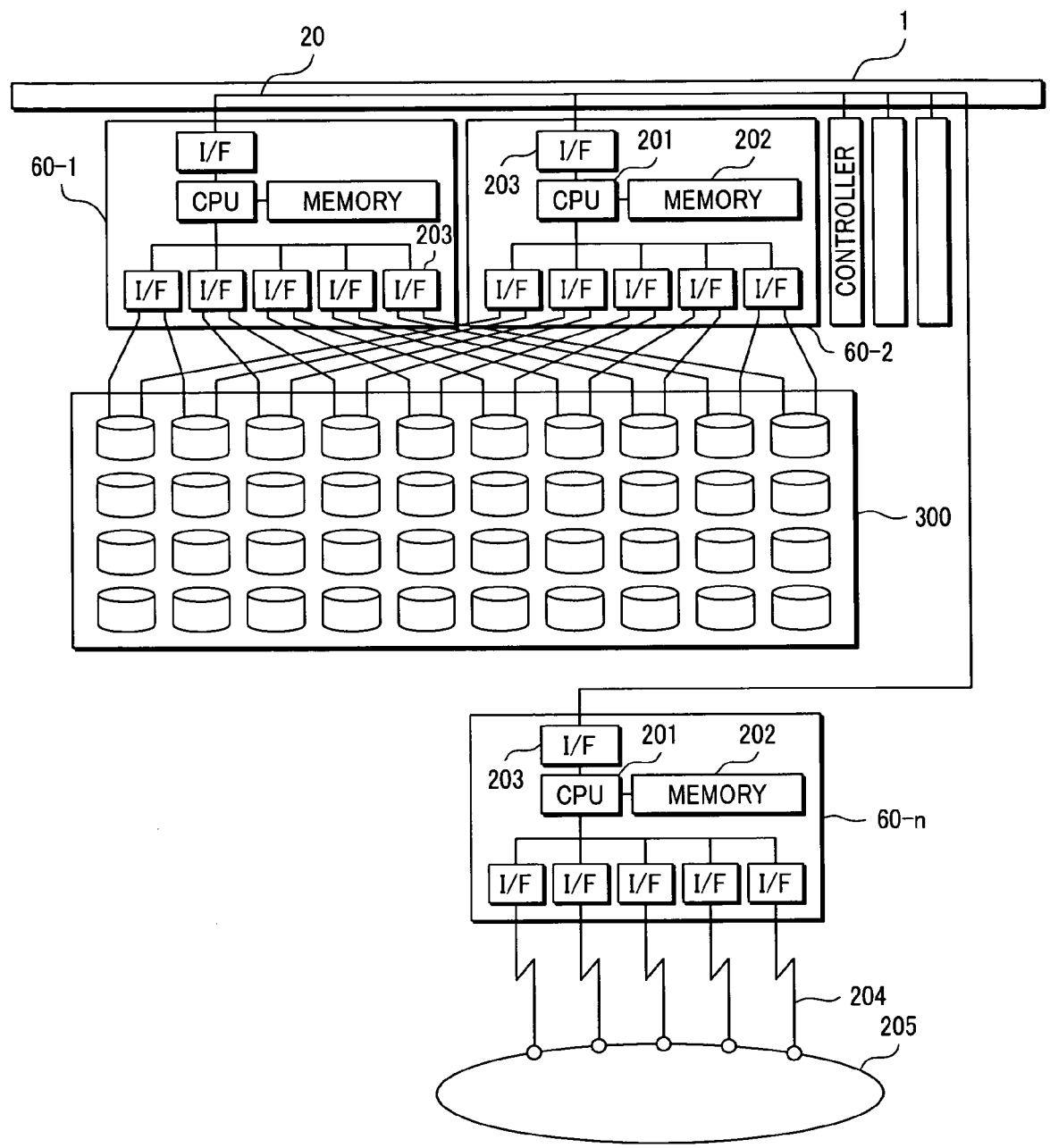
FIG. 15 is a block diagram of a server system connected to a wide area network.

The sixth embodiment will be described using FIG. 15. Here, FIG. 15 is a block diagram of a server system which is connected to a wide area network. Further, in the sixth embodiment, the mother board in the second embodiment is applied to a server system that is a communication apparatus.

Where FIG. 15 differs from FIG. 13 in the fourth embodiment or FIG. 14 in the fifth embodiment is that the modules 60-1 to 60-n are connected to both of a hard disk array (HDD array) 300 and network connection pathways 204.

The modules 60-1 to 60-n are connected to a mother board 1 through transmission lines 20. The mother board 1 allows the jitter of a signal to be decreased by differential signal transmission lines (not shown) whose line-spacing is controlled.

The module 60 includes a processor 201, a memory 202, and plural interface circuits 203 from which the modules 60-1 and 60-2 are connected to the HDD array 300. Further, the module 60-n is connected to the wide area network 205 from the interface circuits 203 through the cables 204.

Data can be read and written from/into the HDD array 300 with a high speed through modules that are allocated to the modules 60-1 to 60-n and are communicated with the host side. Further, the interface circuits 203 receive the data from the HDD array 300, and the CPU 201 computes to which part of the wide area network 205 the data should be transferred with use of the header of the data. The data is then transmitted in the transmission lines on the mother board 1 in such a manner that the data can be reached to the interface circuits 203 in the corresponding module.

Since this structure includes the HDD array 300 with high reliability and large capacity, and the network cables 204 with a high throughput, the apparatus exhibits performance in which advantages of the both are combined. As a result, moving picture information accumulated in the HDD array 300 can be delivered to networks as stream data while being converted into various formats. As the data throughput between the modules 60-1 to 60-n becomes larger, the throughput of the whole system becomes larger. The improvement is realized by contribution of a function by which high throughput data can be transmitted thanks to little jitter of a signal on the mother board 1.

What is claimed is:

1. A printed circuit board, comprising:
a first outer signal layer;
a second outer signal layer;
an inner signal layer;
interlayer connecting via holes that penetrate from the first outer signal layer to the second outer signal layer;
a first pair of differential transmission lines arranged on the first outer signal layer;
a second pair of differential transmission lines arranged on the second outer signal layer; and
a third pair of differential transmission lines arranged on the inner signal layer,
wherein said first pair of differential transmission lines, said second pair of differential transmission lines, and said third pair of differential transmission lines are substantially the same in differential impedance, and said first pair of differential transmission lines is different from said third pair of differential transmission lines in line-spacing.

2. A printed circuit board comprising:
a first outer signal layer;
a first inner signal layer that is located below the first outer signal layer;
a second inner signal layer that is located below the first inner signal layer;
a second outer signal layer that is located below the second inner signal layer;
interlayer connecting via holes that penetrate from the first outer signal layer to the second outer signal layer;
a first pair of differential transmission lines arranged on the first outer signal layer;
a second pair of differential transmission lines arranged on the second outer signal layer;
a third pair of differential transmission lines arranged on the first inner signal layer; and
a fourth pair of differential transmission lines arranged on the second inner signal layer,
wherein said first pair of differential transmission lines, said second pair of differential transmission lines, said third pair of differential transmission lines, and said fourth pair of differential transmission lines are substantially the same in differential impedance, and line-spacing of the third pair of differential transmission lines is wider than that of the fourth pair of differential transmission lines.

3. A printed circuit board comprising:
a first outer signal layer;
a first inner signal layer that is located below the first outer signal layer;

a second inner signal layer that is located below the first inner signal layer;
a second outer signal layer that is located below the second inner signal layer;
interlayer connecting via holes that penetrate from the first outer signal layer to the second outer signal layer;
a first pair of differential transmission lines arranged on the first outer signal layer;
a second pair of differential transmission lines arranged on the second outer signal layer;
a third pair of differential transmission lines arranged on the first inner signal layer; and
a fourth pair of differential transmission lines arranged on the second inner signal layer,
wherein each of said first pair of differential transmission lines and said second pair of differential transmission lines has a microstripline structure, and forward crosstalk coefficients between the first pair and between the second pair are negative;
each of said third pair of differential transmission lines and said fourth pair of differential transmission lines has a stripline structure, and has substantially the same differential impedance; and
distances between the third pair of differential transmission lines and between the fourth pair of differential transmission lines are wider than those between the first pair of differential transmission lines and between the second pair of differential transmission lines, so that degrees of coupling between the third pair and between the fourth pair are decreased.

4. The printed circuit board according to claim 2,
wherein a first connector and a second connector, each having a pin to be mounted on a daughter board, are further provided on the first outer signal layer, and
the pins of the first connector and the second connector are connected to each other through the via holes and the third pair of differential transmission lines, or the via holes and the fourth pair of differential transmission lines.

5. A communication apparatus comprising:
a mother board; and
a plurality of daughter boards connected to the mother board,
wherein said daughter board includes:
a first communication interface connected to the mother board;
a second communication interface connected to a network;
a CPU; and
a memory,
the mother board includes:
a first outer signal layer;
a first inner signal layer that is located below the first outer signal layer;
a second inner signal layer that is located below the first inner signal layer;
a second outer signal layer that is located below the second inner signal layer;
interlayer connecting via holes that penetrate from the first outer signal layer to the second outer signal layer;
a first pair of differential transmission lines arranged on the first outer signal layer;
a second pair of differential transmission lines arranged on the second outer signal layer;
a third pair of differential transmission lines arranged on the first inner signal layer; and
a fourth pair of differential transmission lines arranged on the second inner signal layer, and
said first pair of differential transmission lines, said second pair of differential transmission lines, said third pair of differential transmission lines, and said fourth pair of differential transmission lines are substantially the same in differential impedance, and the line-spacing of the third pair of differential transmission lines is wider than that of the fourth pair of differential transmission lines.

6. A data storage apparatus comprising:
a mother board;
first and second daughter boards connected to the mother board; and
a hard disk array,
wherein said first and second daughter boards include:
a first communication interface connected to the mother board;
a second communication interface connected to the hard disk array;
a CPU; and
a memory, so as to configure a duplication system,
the mother board includes:
a first outer signal layer;
a first inner signal layer that is located below the first outer signal layer;
a second inner signal layer that is located below the first inner signal layer;
a second outer signal layer that is located below the second inner signal layer;
interlayer connecting via holes that penetrate from the first outer signal layer to the second outer signal layer;
a first pair of differential transmission lines arranged on the first outer signal layer;
a second pair of differential transmission lines arranged on the second outer signal layer;
a third pair of differential transmission lines arranged on the first inner signal layer; and
a fourth pair of differential transmission lines arranged on the second inner signal layer, and
said first pair of differential transmission lines, said second pair of differential transmission lines, said third pair of differential transmission lines, and said fourth pair of differential transmission lines are substantially the same in differential impedance, and line-spacing of the third pair of differential transmission lines is wider than that of the fourth pair of differential transmission lines.

7. A communication apparatus comprising:
a mother board;
first to third daughter boards connected to the mother board; and
a hard disk,
wherein said first and second daughter boards include:
a first communication interface connected to the mother board;
a second communication interface connected to the hard disk;
a first CPU; and
a first memory, so as to configure a duplication system,
the third daughter board includes:
a third communication interface connected to the mother board;
a fourth communication interface connected to a network;
a second CPU; and
a second memory,
the mother board includes:
a first outer signal layer;
a first inner signal layer that is located below the first outer signal layer;

a second inner signal layer that is located below the first inner signal layer;

a second outer signal layer that is located below the second inner signal layer;

interlayer connecting via holes that penetrate from the first outer signal layer to the second outer signal layer;

a first pair of differential transmission lines arranged on the first outer signal layer;

a second pair of differential transmission lines arranged on the second outer signal layer;

a third pair of differential transmission lines arranged on the first inner signal layer; and a fourth pair of differential transmission lines arranged on the second inner signal layer, and said first pair of differential transmission lines, said second pair of differential transmission lines, said third pair of differential transmission lines, and said fourth pair of differential transmission lines are substantially the same in differential impedance, and line-spacing of the third pair of differential transmission lines is wider than that of the fourth pair of differential transmission lines.

* * * * *